United States Patent
Jacobs et al.

(10) Patent No.: US 9,989,652 B2
(45) Date of Patent: Jun. 5, 2018

(54) PIXELATED SCINTILLATOR WITH OPTIMIZED EFFICIENCY

(71) Applicant: KONINKLIJKE PHILIPS N.V., Eindhoven (NL)

(72) Inventors: Johannes Wilhelmus Maria Jacobs, Eindhoven (NL); Onno Jan Wimmers, Eindhoven (NL); Jacques Jules Van Oekel, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days. days.

(21) Appl. No.: 15/524,696

(22) PCT Filed: Oct. 30, 2015

(86) PCT No.: PCT/EP2015/075193
§ 371 (c)(1),
(2) Date: May 5, 2017

(87) PCT Pub. No.: WO2016/074945
PCT Pub. Date: May 19, 2016

(65) Prior Publication Data
US 2017/0322320 A1 Nov. 9, 2017

(30) Foreign Application Priority Data
Nov. 13, 2014 (EP) .................................. 14193004

(51) Int. Cl.
*G01T 1/20* (2006.01)
*H01L 27/146* (2006.01)
*G01T 1/24* (2006.01)

(52) U.S. Cl.
CPC ............... *G01T 1/20* (2013.01); *G01T 1/24* (2013.01); *H01L 27/14625* (2013.01); *H01L 27/14663* (2013.01); *H01L 27/14685* (2013.01)

(58) Field of Classification Search
CPC ....... G01T 1/1644; G01T 1/2002; G01T 1/20; G01T 1/24; H01L 27/14663; H01L 27/14625; H01L 27/14685
See application file for complete search history.

(56) References Cited

U.S. PATENT DOCUMENTS 5,690,530 A 11/1997 Jin
7,105,070 B2 9/2006 Tosa
(Continued)

FOREIGN PATENT DOCUMENTS

EP 1089091 A1 4/2001
EP 2717272 A1 4/2014
(Continued)

*Primary Examiner* — David Porta
*Assistant Examiner* — Faye Boosalis
(74) *Attorney, Agent, or Firm* — Larry Liberchuk

(57) ABSTRACT

A method for fabricating a pixelated scintillator including providing a pixelated scintillator-structure and a connection-structure in such a way that the connection-structure is in mechanical contact with two adjacent pixels of the pixelated scintillator-structure. Moreover, the pixelated scintillator-structure includes a first sintering-shrinking-coefficient and the connection-structure includes a second sintering-shrinking-coefficient that is greater than the first sintering-shrinking-coefficient. Further, the pixelated scintillator-structure and the connection-structure are sintered such that a gap between two adjacent pixels of the pixelated scintillator-structure is reduced.

16 Claims, 5 Drawing Sheets

(56) References Cited

U.S. PATENT DOCUMENTS

| | | |
|---|---|---|
| 2004/0042585 A1 | 3/2004 | Nagarkar |
| 2010/0127180 A1 | 5/2010 | Lifshitz |
| 2012/0308837 A1 | 12/2012 | Schlechtriemen |
| 2014/0107823 A1 | 4/2014 | Huang |

FOREIGN PATENT DOCUMENTS

| | | |
|---|---|---|
| JP | 2013115325 A | 6/2013 |
| WO | 2013033389 A1 | 3/2013 |
| WO | 2014021415 A1 | 2/2014 |

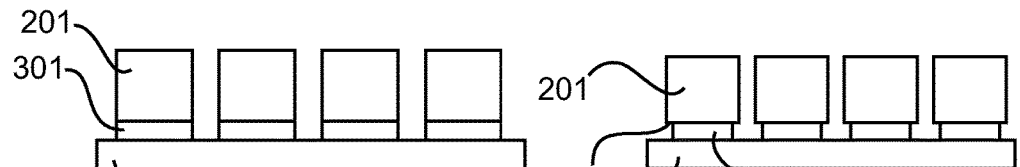
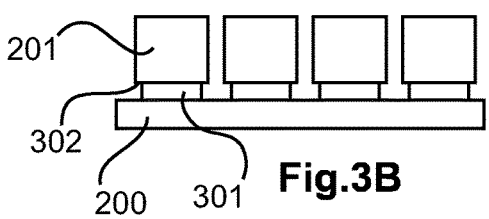
Fig.3A  Fig.3B
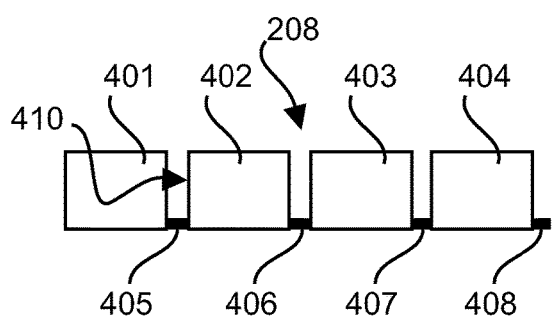
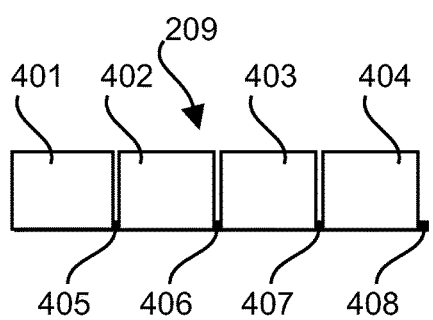
Fig.4A  Fig.4B
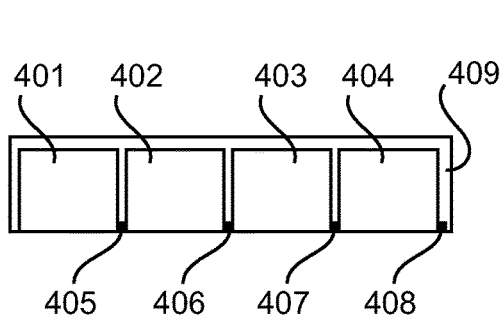
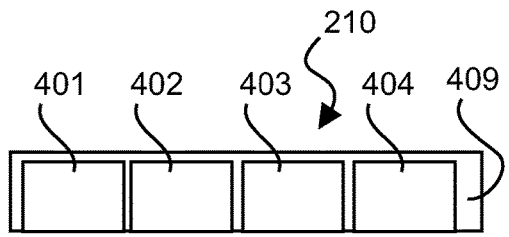
Fig.4C  Fig.4D
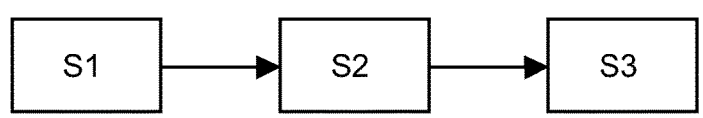
Fig.5

PIXELATED SCINTILLATOR WITH OPTIMIZED EFFICIENCY

CROSS-REFERENCE TO PRIOR APPLICATIONS

This application is the U.S. National Phase application under 35 U.S.C. § 371 of International Application No. PCT/EP2015/075193, filed on Oct. 30, 2015, which claims the benefit of European Patent Application No. 14193004.0, filed on Nov. 13, 2014. These applications are hereby incorporated by reference herein.

FIELD OF THE INVENTION

The invention relates to the field of scintillators. In particular, the invention relates to a method for fabricating a pixelated scintillator and to a pixelated scintillator.

BACKGROUND OF THE INVENTION

Scintillators in radiation detectors may comprise an array of individual pixels which are separated by gaps. Such pixelated scintillators can be formed out of scintillating ceramic material.

In US 2012/0308837 A1 a process for the generative preparation of ceramic-shaped bodies by 3D inkjet printing is described.

SUMMARY OF THE INVENTION

It may be desirable to optimize the efficiency of pixelated scintillators. Aspects of the invention are stated in the independent claims. Advantages and further embodiments are set out in the dependent claims, the description and the figures.

A first aspect of the invention relates to a method for fabricating a pixelated scintillator. The method comprises the step of providing a pixelated scintillator-structure with a first sintering-shrinking-coefficient, the pixelated scintillator-structure comprising two adjacent pixels, both having a top portion and a bottom portion, which are separated by a gap. Furthermore, the method comprises the step of providing a connection-structure, which is in mechanical contact, at the bottom portion of the two adjacent pixels, with both of the two adjacent pixels, wherein the connection-structure comprises a second sintering-shrinking-coefficient that is greater than the first sintering-shrinking coefficient. Moreover, the method comprises the step of sintering the pixelated scintillator-structure and the connection-structure such that the gap is reduced because of the difference between the first and the second sintering-shrinking coefficient.

A gist of the invention may be seen in providing a method for fabricating a pixelated scintillator with a higher or optimized efficiency. This may be realized by providing two different structures, the scintillator-structure and the connection-structure, which have different sintering-shrinking-coefficients in such a way, that the different sintering-shrinking-coefficients cause that the gap separating two adjacent pixels is reduced during the sintering process.

The fabrication method may at least partly comprise steps of additive manufacturing, i.e. added layer manufacturing (ALM) and/or 3D printing. For example, the pixelated scintillator-structure and/or the connection-structure may be provided by means of added layer manufacturing and/or 3D printing. The added layer manufacturing and/or 3D printing process may comprise the consecutive deposition of small suspension droplets (inkjet printing) and/or the deposition of thin locally hardened layers. In general, additive manufacturing, i.e. ALM and/or 3D printing, allows the scintillator-structure to be fabricated layer by layer. The provided structures, i.e. the scintillator-structure and/or the connection-structure, may comprise so-called green phase particles in a binder material. These green phase particles in the binder material may form a ceramic scintillator after a heating step which is also referred to as the sintering step. The pixelated scintillator-structure and/or the connection structure may, e.g., be deposited by additive manufacturing. For example, the pixelated scintillator-structure and/or the connection-structure may be deposited on a working surface.

The scintillator may refer to a device that exhibits scintillation when it is excited by high-energetic photons and/or ionizing radiation, e.g. by X-rays. The pixelated scintillator may comprise a plurality of separated pixels that are configured to be separately and to emit scintillation independently of other pixels of the pixelated scintillator. The pixels of the pixelated scintillator may, for example, have a square-shaped or a circular cross-section. In other words, the pixels of the pixelated scintillator-structure may have a cuboid or cylindrical shape. However, the pixels of the pixelated scintillator-structure may also have a different shape.

The pixelated scintillator, i.e. the pixelated scintillator-structure and/or the connection-structure, can comprise CsI:Tl, Thallium doped Caesium Iodide, or other ceramic scintillating material. For example, the pixelated scintillator, i.e. the pixelated scintillator-structure and/or the connection-structure can comprise a material selected from the group comprising caesium iodide or zinc sulphide or sodium iodide or lutetium oxyorthosilicate or bismuth germanium oxide or any other scintillating material. Particular, scintillating materials like Gadolinium oxyorthosilicate, known as GSO, may be used, which is a type of scintillating inorganic crystal used for imaging in nuclear medicine and for calorimetry or Lutetium-yttrium oxyorthosilicate, also known as LYSO, which is an inorganic chemical compound with main use as a scintillator crystal.

Further, for the pixelated scintillator, i.e. the pixelated scintillator-structure and/or the connection-structure, inorganic scintillators may be used, for example, alkali metal halides, often with a small amount of activator impurity, NaI(Tl) (sodium iodide doped with thallium). Other inorganic alkali halide crystals are, for instance: CsI(Tl), CsI(Na), CsI(pure), CsF, KI(Tl), LiI(Eu). Some non-alkali crystals may include: $BaF_2$, $CaF_2(Eu)$, ZnS(Ag), $CaWO_4$, $CdWO_4$, YAG(Ce) ($Y_3Al_5O_{12}$(Ce)). Moreover, for the pixelated scintillator, i.e. the pixelated scintillator-structure and/or the connection-structure, Yttrium aluminium garnet; YAG, $Y_3Al_5O_{12}$ or any other synthetic crystalline material of the garnet group or of silicate minerals may be used or any intermetallic compound or alloy or any other metallic compounds comprising a rare earth metal, as for instance, Yttrium, Cerium, Terbium, Gallium or Gadolinium.

The providing of the pixelated scintillator-structure may refer to the step of adding the pixelated scintillator-structure. For example, the pixelated scintillator-structure may be added by additive manufacturing, i.e. ALM and/or 3D printing. Moreover, the pixelated-scintillator structure may be added onto the connection structure, which may be added first.

In the context of this invention, the term sintering-shrinking-coefficient may refer to a property of the material of the pixelated scintillator-structure and the connection-structure, respectively. The sintering-shrinking-coefficient may refer to the shrinking factor of the respective material during sintering. For example, the sintering-shrinking-coefficient may be expressed in terms of percents. The sintering-shrinking-coefficient may refer to the percentage of the shrinking of a length of a body made out of that material. For example, a sintering-shrinking-coefficient of 20% may refer to the fact that a length of an object shrinks by 20% during sintering. The sintering-shrinking-coefficient of a material may for example be determined by measuring a length of a body made of this material before and after sintering. In this case, the sintering-shrinking-coefficient may be calculated by dividing the difference of the length before sintering and the length after sintering by the length before sintering. For example, the first sintering-shrinking-coefficient of the pixelated scintillator-structure may amount to 20% and the second sintering-shrinking-coefficient of the connection-structure may amount to 40%. However, these are just exemplary values, which may also be different. The sintering-shrinking coefficient of the pixelated scintillator-structure and the connection structure may, for example, be achieved by selecting a specific relative amount of binder material for the pixelated scintillator-structure and the connection-structure.

Different sintering-shrinking-coefficients may also be achieved by selecting different ceramic materials for the pixelated scintillator-structure and the connection-structure.

The two adjacent pixels may refer to two pixels of the scintillator-structure which are located next to each other and are separated by a gap. In other words, the gap may be located between the two adjacent pixels. The scintillator-structure may also comprise more than two pixels, wherein each pixel of the plurality of pixels may be separated from an adjacent pixel by a gap.

The connection-structure may refer to a structure that connects the two adjacent pixels and is in mechanical contact with the two adjacent pixels. There are different ways to realize the connection-structure. For example, the connection-structure may be realized as a base layer, which may, for example, be located underneath the two adjacent pixels. However, the connection-structure may also be located between the two adjacent pixels, i.e. it may be located in the gap separating the two adjacent pixels. Moreover, the connection-structure may also refer to a continuous structure or to a plurality of isolated connection-structures, which are in mechanical contact with both of the two adjacent pixels. The feature that the connection-structure is in mechanical contact with both of the adjacent pixels may refer to the feature that a shrinking of the connection-structure is transferred to the two adjacent pixels such that the gap between the two adjacent pixels is reduced. The reduction of the gap can relate to the reduction of the width of the gap.

The step of sintering the pixelated scintillator-structure and the connection-structure may refer to a heating step of the scintillator-structure and the connection-structure. For example, sintering is carried out at temperatures between 1600° C. and 1800° C. The sintering may be performed at atmospheric pressure. Moreover, during sintering of the pixelated scintillator-structure and the connection-structure it may not be necessary to fix the geometry of said structures such that they may shrink during sintering, i.e. the sintering step may be carried out in such a way that the geometry of the pixelated scintillator-structure and the connection-structure is not fixed.

The steps of the described method may be carried out in the described order or in another order or even parallel to each other. For example, the providing of the pixelated scintillator-structure may be carried out before, during or after the providing of the connection-structure. Thus, the pixelated scintillator-structure may also be provided at the same time as the connection-structure.

With this method a pixelated scintillator can be fabricated in such a way that the gap between two adjacent pixels is minimized, i.e. such that the pixelated scintillator comprises a bigger detector surface. In this way, the efficiency of the scintillator is optimized.

According to an exemplary embodiment, the connection-structure is a base layer, wherein the pixelated scintillator-structure is deposited onto the base layer.

For example, the base layer is provided first and the pixelated scintillator-structure is deposited in a subsequent step onto the base layer. The base layer may be a continuous layer that is located underneath the pixelated scintillator-structure. Further, the connection-structure may be a base layer and may be deposited on a working surface and the pixelated scintillator-structure may be deposited onto the base layer.

In this way, the base layer may be provided independently from the pixelated scintillator-structure, i.e. in a separated step of the fabricating method described herein. In other words, the device for providing the base layer and the scintillator-structure can be configured for providing the base layer first and for providing the pixelated scintillator-structure in a subsequent step.

According to a further exemplary embodiment, the base layer has a thickness between 0.2 mm and 2 mm and the pixelated scintillator-structure has a thickness between 0.2 mm and 5 mm.

According to a further exemplary embodiment, the method further comprises the step of removing the connection-structure. The connection-structure, e.g. the base layer, may for example be removed by grinding.

According to a further exemplary embodiment, the method further comprises the step of providing an interlayer-structure comprising a third sintering-shrinking-coefficient, wherein the third sintering-shrinking-coefficient is greater than the first sintering-shrinking-coefficient and smaller than the second sintering-shrinking-coefficient. Furthermore, the interlayer-structure is in mechanical contact with the base layer and the pixelated scintillator-structure. Moreover, the interlayer-structure is sintered together with the base layer and the pixelated scintillator-structure.

In other words, an interlayer-structure may be provided between the base layer and the pixelated scintillator-structure, wherein the interlayer-structure comprises an intermediate sintering-shrinking-coefficient, such that stresses between the base layer and the pixelated scintillator-structure, which may be due to the different sintering-shrinking-coefficients, can be reduced. In this way, a warpage of the scintillator can be avoided or at least reduced. Moreover, the interlayer-structure can itself comprise a plurality of different layers with different sintering-shrinking-coefficients such that the interlayer has a gradient of sintering-shrinking-coefficients. Moreover, the interlayer-structure may also be provided as a continuous layer that is deposited onto the base layer. It is also possible to provide the interlayer-structure as separated interlayer-structures which are located between the base layer and each pixel, i.e. such that each pixel comprises an interlayer structure located between the pixel and the base layer.

According to a further exemplary embodiment, the connection-structure is provided in the gap separating the two adjacent pixels. The connection-structure may for example continuously fill the gap separating the two adjacent pixels or be provided as isolated dots in the gap separating the two adjacent pixels.

In other words, the connection-structure may be provided between the scintillator pixels, for example at the bottom part of the pixelated scintillator-structure. By providing the connection-structure as isolated dots between the pixels, i.e. not as a continuous structure, the warpage of the pixelated scintillator-structure may be further reduced or avoided. Moreover, the connection-structure may only be located on one end of the gap, e.g. on the lower end. After sintering the portion of the pixelated scintillator-structure comprising the connection-structure in the gap separating the two adjacent pixels, e.g. the lower end, can be removed, for example by grinding.

According to a further exemplary embodiment, the providing of the pixelated scintillator-structure is done by additive layer manufacturing. Moreover, also the providing of the connection-structure and/or the interlayer structure may be done by additive layer manufacturing.

In the context of the invention, the additive layer manufacturing may also refer to 3D printing, this may be carried out by consecutive deposition of small suspension droplets (inkjet printing) or by consecutive deposition of thin locally hardened layers. According to a further exemplary embodiment, the pixels of the provided pixelated scintillator-structure have a width between 0.05 mm and 2 mm and the gap of the provided pixelated scintillator-structure has a width below 150 µm after sintering. Preferably, the width of the gaps of the provided pixelated scintillator-structure may have a width below 100 µm, more preferable below 50 µm, even more preferable below 10 µm, after sintering.

According to a further exemplary embodiment, the ratio between the first sintering-shrinking-coefficient and the second sintering-shrinking-coefficient is between 0.95 and 0.2. For example, the pixelated scintillator-structure may comprise a first sintering-shrinking-coefficient amounting to 20% and the connection-structure may comprise a second sintering-shrinking-coefficient amounting to 40%.

With such a ratio of the first and second sintering-shrinking-coefficients, the shrinkage of the gap is stronger than the shrinkage of the pixel such that the scintillator surface and the efficiency of the scintillator are enhanced.

According to a further exemplary embodiment, the provided scintillator-structure comprises a scintillating ceramic material with a first relative amount of binding material. The provided connection-structure comprises the scintillating ceramic material with a second relative amount of binding material. Hereby, the first relative amount of binding material and the second relative amount of binding material are different.

The relative amount of binding material may refer to the particle concentration of binding material in the scintillator-structure and the connection-structure, respectively. The difference between the first relative amount of binding material and the second relative amount of binding material may cause that the first sintering-shrinking-coefficient is different than the second sintering-shrinking-coefficient.

According to another exemplary embodiment, the method further comprises the step of coating the pixelated scintillator-structure with a reflective coating material. By coating the pixelated scintillator-structure the gaps separating the pixels may be filled with a light-reflective material.

For example, the pixelated scintillator-structure may be coated with a light-reflective material, e.g. an epoxy material with reflective, e.g. white, particles. The epoxy material may be a $TiO_2$-filled epoxy reflector. Alternatively, thin reflective layers of Al or Ag can be applied to the pixelated scintillator-structure.

Another aspect of the invention relates to a pixelated scintillator comprising: a pixelated scintillator-structure with a first sintering-shrinking-coefficient, the pixelated scintillator-structure comprising two adjacent pixels which are separated by a gap. The pixelated scintillator furthermore comprises a connection-structure, which is in mechanical contact with both of the two adjacent pixels, wherein the connection-structure comprises a second sintering-shrinking-coefficient that is greater than the first sintering-shrinking coefficient.

The features of the pixelated scintillator described with respect to the method described herein may also describe or define the pixelated scintillator according to this aspect of the invention. The pixelated scintillator according to this aspect of the invention may, e.g., be an intermediate product of the method described herein. For example, the pixelated scintillator may emerge before the sintering process. This pixelated scintillator may have the property that the gap is reduced more than the pixels such after sintering the pixelated scintillator such that the scintillator surface and the efficiency of the scintillator are maximized.

A further aspect of the invention relates to a pixelated scintillator comprising a pixelated scintillator-structure comprising two adjacent pixels which are separated by a gap (212), wherein the gap has a width below 150 µm. Preferably, the width of the gaps of the pixelated scintillator-structure may have a width below 100 µm, more preferable below 50 µm, even more preferable below 10 µm.

The pixelated scintillator may be fabricated with a method described in the context of the present invention. Thus, the pixelated scintillator may relate to a final product of the method described herein. For example, the pixelated scintillator is fabricated by added layer manufacturing, e.g. ALM and/or 3D printing. Moreover, the pixelated scintillator structure may be sintered as described with respect to the described method.

The pixelated scintillator may comprise materials used in the described fabrication method. Thus, the pixelated scintillator structure may comprise a scintillating ceramic material, e.g., CsI:Tl, Thallium doped Caesium Iodide or any other ceramic scintillating material described herein.

According to an exemplary embodiment, wherein the pixels of the pixelated scintillator-structure have a width between 0.05 mm and 2 mm. Furthermore, the pixelated scintillator-structure has a thickness between 0.2 mm and 5 mm.

A further aspect of the invention relates to a detector comprising a pixelated scintillator described in the context of the present invention.

The detector may be a radiation detector, e.g. an X-ray detector.

A further aspect of the invention relates to an imaging apparatus comprising a detector described in the context of the invention.

The imaging apparatus may be a medical imaging apparatus. e.g. an X-ray imaging apparatus.

These and other aspects of the invention will be apparent from and elucidated with reference to the embodiments described hereinafter.

BRIEF DESCRIPTION OF THE DRAWINGS

FIGS. 3A and 3B show a pixelated scintillator with an interlayer before and after sintering according to exemplary embodiments of the invention.

FIGS. 4A to 4D show different fabrication steps of a pixelated scintillator according to exemplary embodiments of the invention.

FIG. 5 shows a flow-chart of a method according to an exemplary embodiment of the invention.

The figures are schematic and not true to scale. If the same reference signs are used in different figures, they may refer to identical or similar elements. However, similar or identical elements may also be labelled with different reference signs.

DETAILED DESCRIPTION OF EMBODIMENTS

For the sake of clarity, pixelated scintillators with a small number of pixels are shown in the exemplary embodiments. However, the pixelated scintillator may also have a greater number of pixels, e.g. 16×16 pixels, or another number of pixels.

Figure 1:
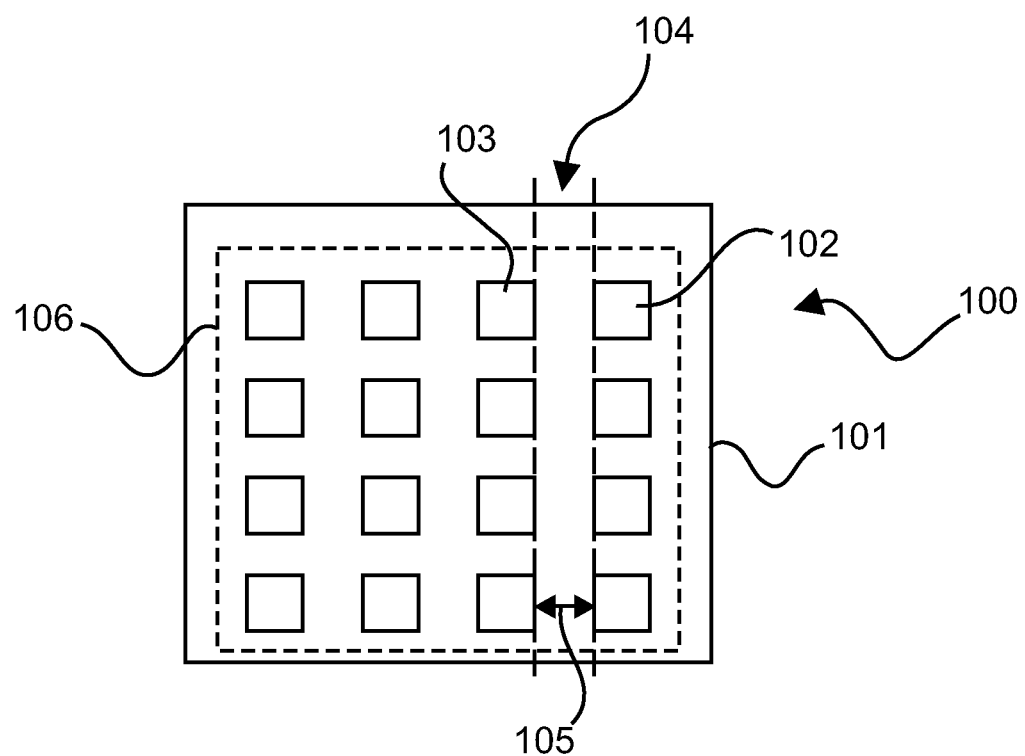
FIG. 1 shows a pixelated scintillator according to an exemplary embodiment of the invention.

FIG. 1 shows a pixelated scintillator 100 according to an exemplary embodiment of the invention. The pixelated scintillator 100 comprises a pixelated scintillator-structure 106 with a first sintering-shrinking-coefficient, the pixelated scintillator-structure 106 comprising two adjacent pixels 102, 103 which are separated by a gap 104. Furthermore, the pixelated scintillator 100 comprises a connection-structure 101, which is in mechanical contact, only at the base of the two adjacent pixels, with both of the two adjacent pixels 102, 103, wherein the connection-structure 101 comprises a second sintering-shrinking-coefficient that is greater than the first sintering-shrinking-coefficient. The sintering-shrinking coefficients are, e.g., explained with reference to FIG. 6.

In this exemplary embodiment, the connection-structure 101 is a base layer, on which the pixelated scintillator-structure 106 is provided. The base layer 101 is for example also provided by additive manufacturing and/or 3D printing and is formed as a continuous planar layer.

The pixelated scintillator 100 according to this exemplary embodiment is an intermediate product of the method described herein and is shown before the sintering step. Before the sintering, the gap 104 separating the two adjacent pixels 102 and 103 has a width 105, which, for example, amounts to 100 μm or more. After sintering, the width 105 of the gap 104 will be less than 50 μm.

FIGS. 2A to 2E show different intermediate products of the method for fabricating a pixelated scintillator described herein. The figures are shown in a side view.

Figure 2A:
FIGS. 2A to 2E show different fabrication steps of a pixelated scintillator according to exemplary embodiments of the invention.

In FIG. 2A, a connection-structure 200, in this embodiment a base layer 200, which is provided according to the described method, is shown. The base layer 200 comprises a second sintering-shrinking-coefficient.

Figure 2B:
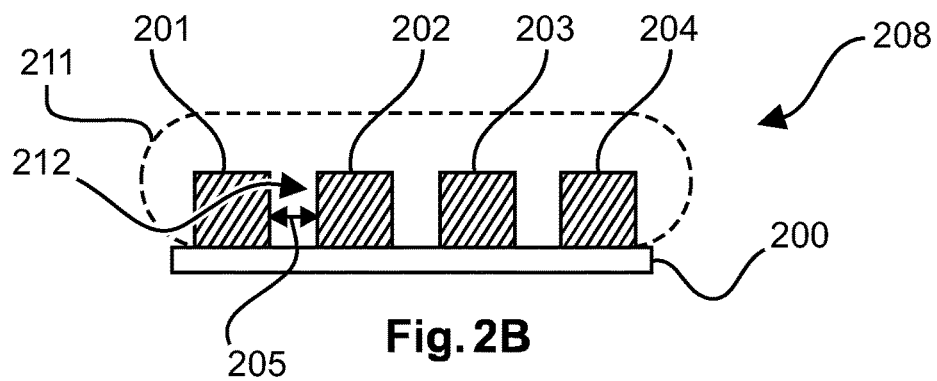

In FIG. 2B, the intermediate product after providing the pixelated scintillator-structure 211 is shown. The pixelated scintillator-structure 211 is deposited onto the base layer 200 and comprises a plurality of separated pixels 201, 202, 203 and 204. The adjacent pixels 201 and 202 are separated by a gap 212 which has a width 205. This intermediate product is a pixelated scintillator before sintering 208, wherein the width 205 of the gap 212 separating the two adjacent pixels 201 and 202, for example, amounts to 100 μm. The pixelated scintillator-structure comprises a first sintering-shrinking-coefficient, which is smaller than the second sintering-shrinking-coefficient of the base layer 200.

Figure 2C:
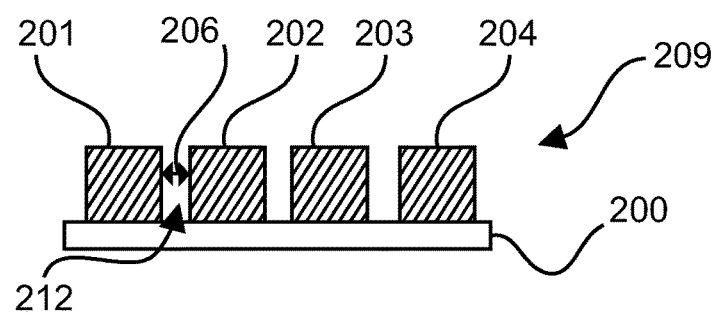

In FIG. 2C, a pixelated scintillator after sintering 209 is shown, i.e. an intermediate product of the method described herein. During the sintering step the pixels 201, 202, 203 and 204 as well as the base layer 200 have shrunk. However, due to the greater second sintering-shrinking-coefficient of the base layer 200, the base layer 200 has shrunk more than the pixels 201, 202, 203 and 204, such that the width 206 of the gap 212 has shrunk more than the pixels 201, 202, 203 and 204.

Figure 2D:
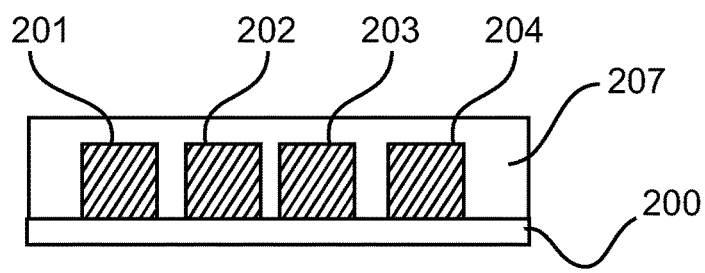

In FIG. 2D, the intermediate product of the method described herein is shown after the pixels 201, 202, 203 and 204 located on the base layer 200 are coated with a coating material 207, for example, an epoxy reflector.

Figure 2E:
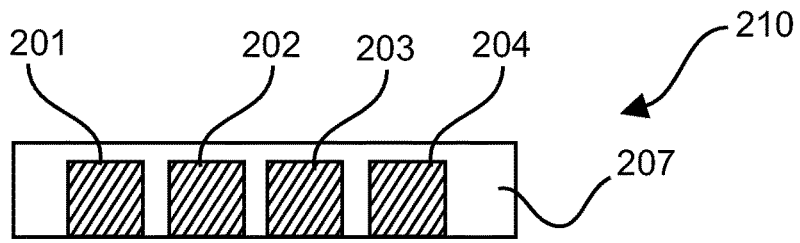

In FIG. 2E, the final pixelated scintillator 210 is shown after the base layer 200 has been removed, for example, has been grinded away. Thus, only the pixelated scintillator-structure comprising the pixels 201, 202, 203 and 204 as well as the coating material 207 remains.

In FIGS. 3A and 3B, a pixelated scintillator is shown before and after the sintering step, wherein the pixelated scintillator comprises an interlayer structure 301. In FIG. 3A it is shown that the pixelated scintillator before sintering comprises a connection-structure 200, in this case a base layer 200 as well as separated pixels, wherein between each pixel 201 and the base layer 200, an interlayer structure 301 is located. According to this exemplary embodiment, the base layer 200 is provided first and subsequently the interlayer structure 301 is provided. The interlayer structure 301 is provided in such a way that it comprises a plurality of separated interlayer structures 301, which are provided at the positions where the pixel 201 will be provided. However, the interlayer structure 301 may also be provided as a continuous layer, which is located on the base layer 200.

In FIG. 3B, the pixelated scintillator comprising interlayer structures is shown after the sintering step. Since the interlayer structure 301 has a third sintering-shrinking-coefficient that is smaller than the second sintering-shrinking-coefficient of the base layer 200 and is greater than the first sintering-shrinking-coefficient of the pixel 201 of the pixelated scintillator-structure, the interlayer structure 301 has an intermediate shrinkage. In other words, the interlayer structure 301 shrinks less than the base layer 200 and shrinks more the pixel 201 during the sintering step. In this way, less stresses are caused between the base layer 200 and the pixelated scintillator-structure comprising the pixel 201.

In FIGS. 4A to 4D, intermediate products of a method described herein are shown, wherein the connection-structure comprises a plurality of separated connection-structures that are located between the pixels of the pixelated scintillator-structure.

In FIG. 4A it is shown that a plurality of pixels 401, 402, 403 and 404 are provided, wherein the connection-structure comprises separated connection-structures 405, 406, 407 and 408 that are located between the pixels. In other words, the adjacent pixels 401 and 402 are separated by a gap 410, wherein the connection-structure 405 is located in the gap 410. In this way, the connection-structure 405 is in mechanical contact with both of the adjacent pixels 401 and 402. Equally, the connection-structures 406 and 407 are also located in the gap between the two adjacent pixels 402 and 403 or 403 and 404. Thus, in FIG. 4A, the pixelated scintillator before sintering 208 is shown. The connection-structures 405, 406, 407 and 408 may be provided in a way that they do not fill the complete gap. For example, they may only be provided in the lower part of the gap and the pixelated scintillator-structure, respectively.

In FIG. 4B, the pixelated scintillator after sintering 209 is shown. During sintering, the pixels 401, 402, 403 and 404 as well as the connection-structures 405, 406, 407 and 408 have shrunk. However, since the second sintering-shrinking-coefficient of the connection-structures is greater than the first sintering-shrinking-coefficient of the pixelated scintillator-structure comprising the pixels 401, 402, 403 and 404, the gaps between the pixels have shrunk more than the pixels.

In FIG. 4C, the pixelated scintillator fabricated with the method described herein is shown after coating the pixels 401, 402, 403 and 404 and the connection-structures 405, 406, 407 and 408 with a coating material 409, for example with an epoxy reflector. In FIG. 4D, the final pixelated scintillator 210 is shown, in which the lower part of the pixels 401, 402, 403 and 404, where the connection-structures 405, 406, 407 and 408 were located, has been removed, for example, grinded away. Thus, only the pixels 401, 402, 403 and 404 of the pixelated scintillator-structure and the coating material 409 remain.

Although it is shown in exemplary embodiments that the pixelated scintillator is coated with a coating material and that the connection-structure is removed, there may also be pixelated scintillators, where this step is not performed.

In FIG. 5, a flow-chart for a method for fabricating a pixelated scintillator according to an exemplary embodiment of the invention is shown. Step S1 of the method relates to the step of providing a pixelated scintillator-structure with a first sintering-shrinking-coefficient, the pixelated scintillator-structure comprising two adjacent pixels which are separated by a gap. Step S2 relates to providing a connection structure, which is in mechanical contact with both of the two adjacent pixels, wherein the connection-structure comprises a second sintering-shrinking-coefficient that is greater that the first sintering-shrinking-coefficient. In step S3, the sintering of the pixelated scintillator-structure and the connection-structure such that the gap is reduced is carried out.

Although it is shown that the steps S1, S2 and S3 are performed subsequently, these steps may also be performed in a different order. For example, the step S2 can be performed before the step S1. Moreover, it is possible to carry out the steps S1 and S2 at the same time. For example, when providing the connection-structure between two adjacent pixels as shown in FIGS. 4A to 4D, the pixelated scintillator-structure and the connection-structure can be provided in the same method step, for example, with the same print head.

Figure 6:
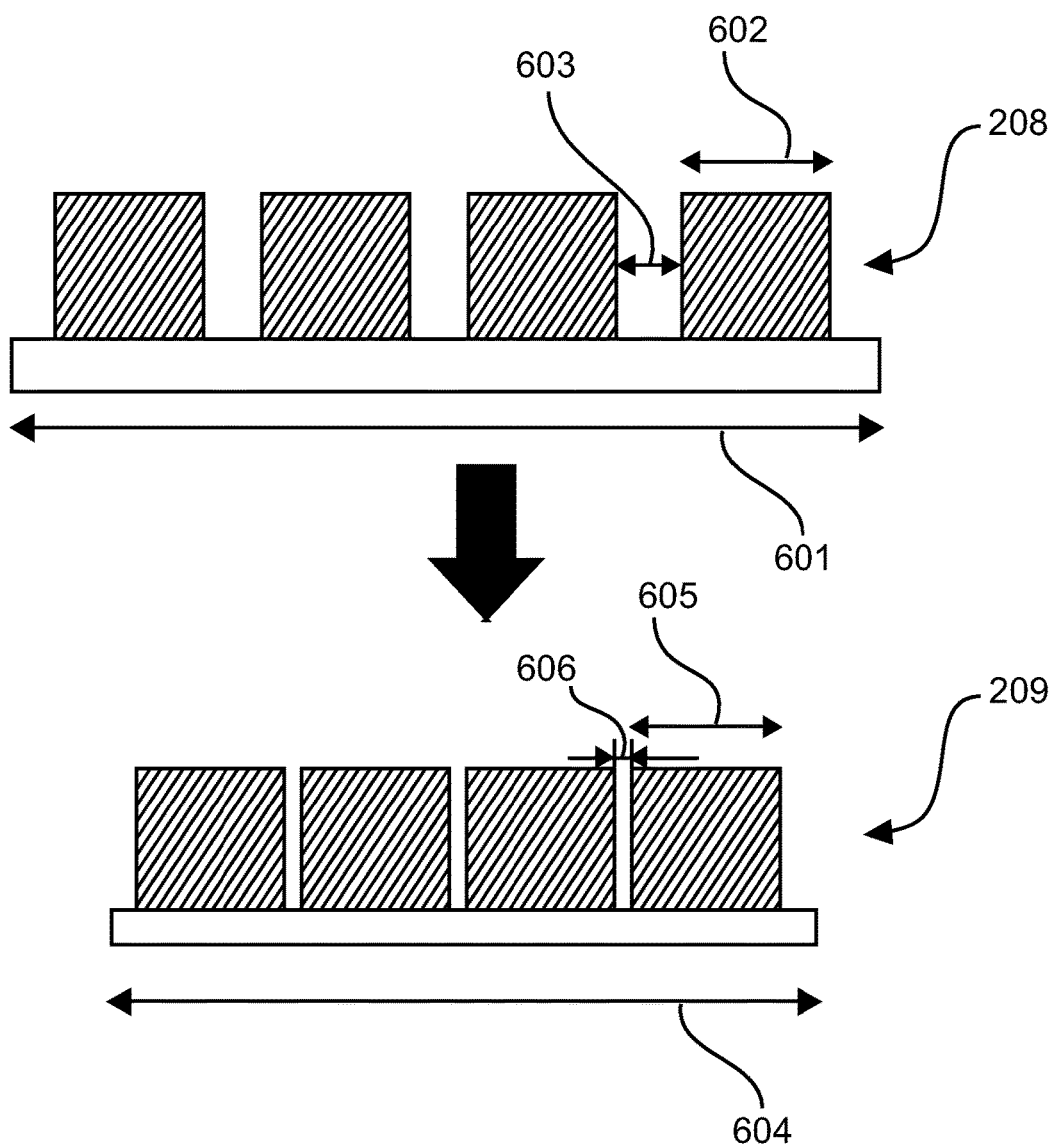
FIG. 6 shows a pixelated scintillator according to an exemplary embodiment of the invention before and after sintering.

FIG. 6 shows a pixelated scintillator according to an exemplary embodiment of the invention before sintering 208 and the same pixelated scintillator after sintering 209. The pixelated scintillator, for example, corresponds to the one described with respect to FIGS. 2A to 2E. Before sintering, the connection-structure, i.e. the base layer, has a length $S_p$ 601, the pixel has a width $P_p$ 602, and the gap between two adjacent pixels has a width $G_p$ 603. After sintering, the connection-structure has a length $S_s$ 604, the pixel has a width $P_s$ 605, and the gap between two adjacent pixels has a width $G_s$ 605. The first sintering-shrinking-coefficient $C_1$ of the pixelated scintillator-structure can be calculated as $$C_1 = (P_p - P_s)/P_p.$$

The second sintering-shrinking-coefficient $C_2$ of the connection-structure can be calculated as $$C_2 = (S_p - S_s)/S_p.$$

As explained before, the second sintering-shrinking is greater than the first sintering-shrinking coefficient, i.e. the base layer has a greater shrinkage during sintering than the pixelated scintillator-structure. The sintering-shrinking-coefficient of the gap is approximately equal to the second sintering-shrinking-coefficient $C_2$.

Figure 7:
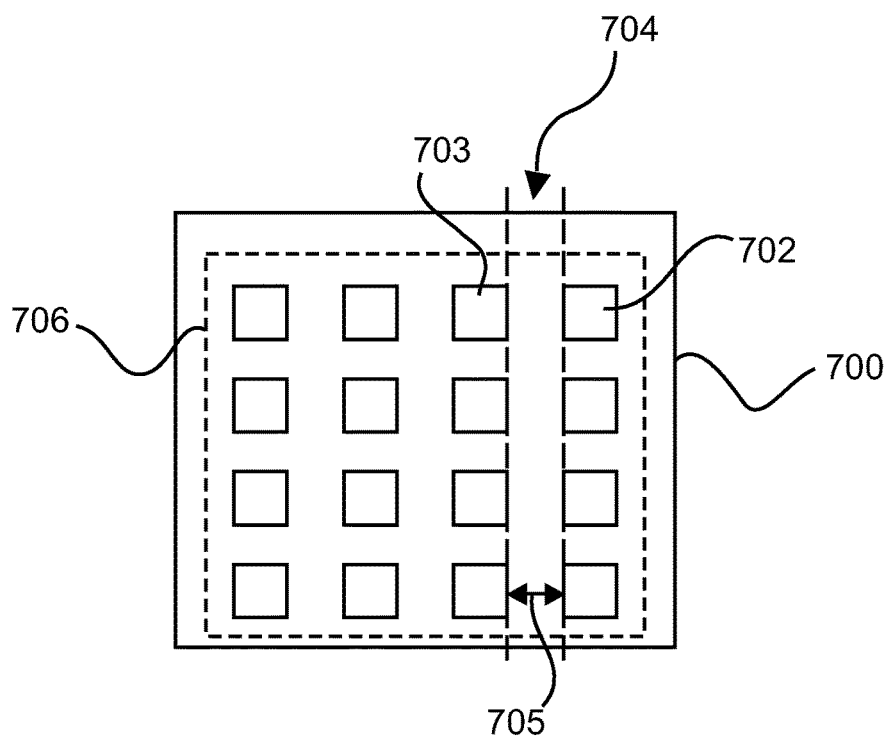
FIG. 7 shows a detector according to an exemplary embodiment of the invention.

FIG. 7 shows a detector 700 comprising pixelated scintillator 706 described in the context of the present invention. The pixelated scintillator comprises a sintered pixelated scintillator structure comprising at least two adjacent pixels 702 and 703 which are separated by a gap 704. The width 705 of the gap 704 is smaller than 150 μm.

Figure 8:
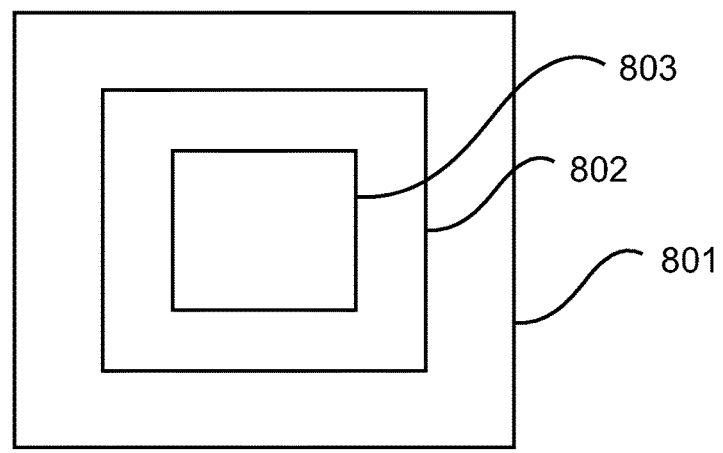
FIG. 8 shows an imaging apparatus according to an exemplary embodiment of the invention.

FIG. 8 shows an imaging apparatus 801 comprising a detector 802 described in the context of the invention, e.g. the detector shown in FIG. 7. The detector 802 comprises a pixelated scintillator 803.

Other variations to the disclosed embodiments can be understood and effected by those skilled in the art in practising the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A method for fabricating a pixelated scintillator, the method comprising acts of:
    providing a pixelated scintillator-structure with a first sintering-shrinking-coefficient, the pixelated scintillator-structure comprising two adjacent pixels both having a top portion and a bottom portion which are separated by a gap;
    providing a connection-structure, which is in mechanical contact, at the bottom portion of the two adjacent pixels, with both of the two adjacent pixels, wherein the connection-structure comprises a second sintering-shrinking-coefficient that is greater than the first sintering-shrinking coefficient; and
    sintering the pixelated scintillator-structure and the connection-structure.

2. The method according to claim 1,
    wherein the connection-structure is a base layer; and
    wherein the pixelated scintillator-structure is deposited onto the base layer.

3. The method according claim 2,
    wherein the base layer has a thickness between 0.2 mm and 2 mm; and
    wherein the pixelated scintillator-structure has a thickness between 0.2 mm and 5 mm.

4. The method according to claim 2, further comprising an act of:
    providing an interlayer structure comprising a third sintering-shrinking-coefficient, wherein the third sintering-shrinking-coefficient is smaller than the second sintering-shrinking-coefficient and is greater than the first sintering-shrinking-coefficient, the interlayer structure being in mechanical contact with the base layer and the pixelated scintillator-structure; and wherein the interlayer structure is sintered together with the base layer and the pixelated scintillator-structure.

5. The method according to claim 1, further comprising an act of:
removing the connection-structure.

6. The method according to claim 1,
wherein the connection-structure is provided in the gap separating the two adjacent pixels.

7. The method according to claim 1,
wherein the act of providing of the pixelated scintillator-structure is done by additive layer manufacturing.

8. The method according to claim 1,
wherein the two adjacent pixels each has a width between 0.05 mm and 2 mm and the gap of the provided pixelated scintillator-structure has a width below 150 μm after the sintering act.

9. The method according to claim 1,
wherein a ratio between the first sintering-shrinking-coefficient and the second sintering-shrinking-coefficient is between 0.95 and 0.2.

10. The method according to claim 1,
wherein the pixelated scintillator-structure comprises a scintillating ceramic material with a first relative amount of binding material;
wherein the connection-structure comprises the scintillating ceramic material with a second relative amount of binding material; and
wherein the first relative amount and the second relative amount are different.

11. The method according to claim 1, further comprising an act of:
coating the pixelated scintillator-structure with a reflective coating material.

12. A detector comprising a pixelated scintillator manufactured by the method of claim 1.

13. An imaging apparatus comprising a detector according to claim 12.

14. A pixelated scintillator, comprising:
a pixelated scintillator-structure having a first sintering-shrinking-coefficient and comprising two adjacent pixels which are separated by a gap and have a top portion and a bottom portion; and
a connection-structure, which is in mechanical contact, at the bottom portion of the two adjacent pixels, with both of the two adjacent pixels, wherein the connection-structure comprises a second sintering-shrinking-coefficient that is greater than the first sintering-shrinking coefficient.

15. The pixelated scintillator according to claim 14,
wherein the two adjacent pixels of the pixelated scintillator-structure each has a width between 0.05 mm and 2 mm; and
wherein the pixelated scintillator-structure has a thickness between 0.2 mm and 5 mm.

16. The pixelated scintillator according to claim 14, wherein the gap has a width below 150 μm.

\* \* \* \* \*